United States Patent [19]

Noguchi

[11] Patent Number: 4,909,886
[45] Date of Patent: Mar. 20, 1990

[54] PROCESS FOR PRODUCING COPPER-CLAD LAMINATE

[75] Inventor: Kazuo Noguchi, Tokyo, Japan

[73] Assignee: Mitsubishi Gas Chemical Company, Inc., Tokyo, Japan

[21] Appl. No.: 279,003

[22] Filed: Dec. 2, 1988

[30] Foreign Application Priority Data

Dec. 2, 1987 [JP] Japan .............................. 62-303284
Mar. 1, 1988 [JP] Japan .............................. 63-45771

[51] Int. Cl.$^4$ .................... B32B 31/08; B32B 31/20
[52] U.S. Cl. .................................. 156/285; 156/286; 156/312; 156/324; 156/382
[58] Field of Search ............... 156/324, 286, 285, 312, 156/382

[56] References Cited

U.S. PATENT DOCUMENTS

| 3,305,416 | 2/1967 | Kahan ................................ 156/286 |
| 3,960,635 | 6/1976 | La Roy et al. .................. 156/312 X |
| 4,579,612 | 4/1986 | Held ................................ 156/324 X |
| 4,659,425 | 4/1987 | Eggers et al. ................... 156/324 X |
| 4,670,080 | 6/1987 | Schwarz et al. ................ 156/324 X |

FOREIGN PATENT DOCUMENTS 63-118242 5/1988 Japan ................................ 156/286

Primary Examiner—Robert A. Dawson
Assistant Examiner—Michele K. Yoder
Attorney, Agent, or Firm—Sughrue, Mion, Zinn, Macpeak & Seas

[57] ABSTRACT

A process for continuously producing a copper-clad laminate by double belt pressing which comprises heating a laminating material comprising at least one resin-impregnated base of continuous length and a copper foil of continuous length superposed on at least one of the outer surfaces of the base(s) between a pair of belts under pressure, wherein a laminating material having been continuously heat-fused under reduced pressure in a vacuum chamber is used. The pressure applied to the laminating material during heating under pressure can be reduced to a range of from 10 to 30 kg/cm$^2$.

5 Claims, 1 Drawing Sheet

PROCESS FOR PRODUCING COPPER-CLAD LAMINATE

FIELD OF THE INVENTION

This invention relates to an improved process for continuously producing a copper-clad thermosetting resin laminate for use as printed circuit boards iin electrical or electronic equipments.

BACKGROUND OF THE INVENTION

Known processes for producing a copper-clad laminate include a continuous double belt pressing process, in which a laminating material comprising a desired number of resin-impregnated bases (prepregs) in continuous lengths and a copper foil of continuous length superposed on at least one of the outer surfaces of the bases is heated under pressure between a pair of belts as disclosed in JP-A-61-10456 (the term "JP-A" as used herein means an "unexamined published Japanese patent application").

According to this technique, resin-impregnated bases and a copper foil(s) both at room temperature are supplied between a pair of belts and heated at a temperature of about 200° C. under a pressure of 50 kg/cm$^2$ or higher in a heating zone of the double belt press to cure the rein. The united laminate is then rapidly cooled under pressure in a cooling zone of the double belt press and delivered out of the double belt press.

Application of high pressure of 50 kg/cm$^2$ or more in the heating zone has been an essential condition in order to obtain a laminate free from bubbles, etc. However, use of such a high pressure has been attended by various problems. For example, in cases where a fluid, e.g., air or oil, is used as a pressurizing medium, a special sealing device was necessary to prevent the medium from leaking, making the apparatus large-sized. Still yet, it was difficult to completely prevent leakage. On the other hand, when rollers are employed to exert the presure, a large number of rollers having a small diameter are needed from the standpoint of assuring surface smoothness. However, since the load imposed on the rollers sufficient for applying the desired pressure would be too high for their strength, some devices such as a back-up mechanism should be required to prevent breakage of the small diameter rollers.

In an attempt of overcoming the disadvantages associated with the above-stated pressurizing processes, it has ben proposed to use a molten metal as a pressurizing medium and the laminate is pressed by the medium in the form a solid formed by cooling the molten metal to a temperature below its melting point. This technique, however, presents another problem in handling of the solidified metal.

In the above-described conventional laminating process, the resin-impregnated bases and copper foils supplied have room temperature. Immediately after curing of the resin by heating under pressure,, the copper-clad laminate is rapidly cooled under pressure to a temperature less than the glass transition point of the resin, followed by delivery. The resin-impregnated bases, copper foils, and steel belts for double belt pressing differ in coefficient of thermal expansion from each other. Therefore, rapid heating in the heating zone sometimes causes wrinkling of the copper foil due to the difference in thermal expansion. In order to prevent this, it has been suggested to previously apply sufficient tension to each of the resin-impregnated bases and the copper foils, but such a device was still unsatisfactory. Even if wrinkling does not occur, rapid cooling of the cured copper-clad laminate to a temperature less than the glass transition point of the resin under pressure leaves a great internal stress within the resulting copper-clad laminate, which would lead to dimensional instability.

SUMMARY OF THE INVENTION

One object of this invention is to provide a process for producing a copper-clad laminate by double belt pressing, in which the requisite pressure applied to the laminate is greatly reduced as compared with the conventional double belt pressing processes without causing bubbling.

Another object of this invention is to provide a process for producing a copper-clad laminate by a double belt pressing process which neither causes wrinkling of the copper foil nor leaves a great residual stress in the resulting laminate.

As a result of extensive investigations, the inventors have found a process of using a laminating material having been previously haat-fused under reduced pressure. It has further been found that a copper-clad laminate free from wrinkles of the copper foil and having a reduced residual internal stress can be obtained by previously heating the resin-impregnated bases and copper foils and controlling the temperature for cooling the cured copper-clad laminate in the cooling zone above the glass transition point of the resin, thereby establishing a process for providing a copper-clad laminate whose dimensional changes are minimized while using a reduced pressure for pressing.

That is, a first invention relates to an improvement in a process for continuously producing a copper-clad laminate by double belt pressing which comprises heating a laminating material comprising at least one resin-impregnated base of continuous length and a copper foil of continuous length superposed on at least one of the outer surfaces of the base(s) between a pair of belts under pressure, said improvement comprises using a laminating material having been continuously heat-fused under reduced pressure in a vacuum chamber. In a preferred embodiment of the first invention, the reduced pressure for continuous heat-fusion is not more than 500mmmHg, and the air in the vicinity of the inlet and outlet of the vacuum chamber for continuous heat-fusion, through which the resin-impregnated bases and copper foils are introduced and delivered, has a cleanness class of 100,000 or less.

A second invention relates to an improvement in a process for continuously producing a copper-clad laminate by the above-mentioned double belt pressing process, said improvement comprises using a laminating material having been continuously heat-fused under reduced pressure in a vacuum chamber and controlling temperature changes among the heat-fused laminating material, the pair of belts, and the copper-clad laminate in the heating zone and the cooling zone of the doube belt press within a range of 100° C. In a preferred embodiment of the second invention, the resin-impregnated bases and copper foils are heat-fused to a temperature not less than 100° C. and supplied between the pair of belts while being kept at that temperature; the pair of belts at the inlet for supplying the resin-impregnated bases and copper foils are heated to a temperature not less than 100° C.; and the temperature of the copper-clad laminate while being delivered out of the cooling zone of the double belt press is at a temperature higher than the glass transition point of the resin by at least 20° C.

According to the improved process of this invention, the pressure condition of th double belt press can be greatly relieved to 10 to 30 kg/cm2, and the resulting copper-clad laminate is excellent in dimensional stability, i.e., freedom from dimensional change or warpage.

BRIEF DESCRIPTION OF THE ACCOMPANYING DRAWINGS

FIGS. 1 and 2 each schematically illustrates the process of the present invention.

DETAILED DESCRIPTION OF THE INVENTION

Figure 1:
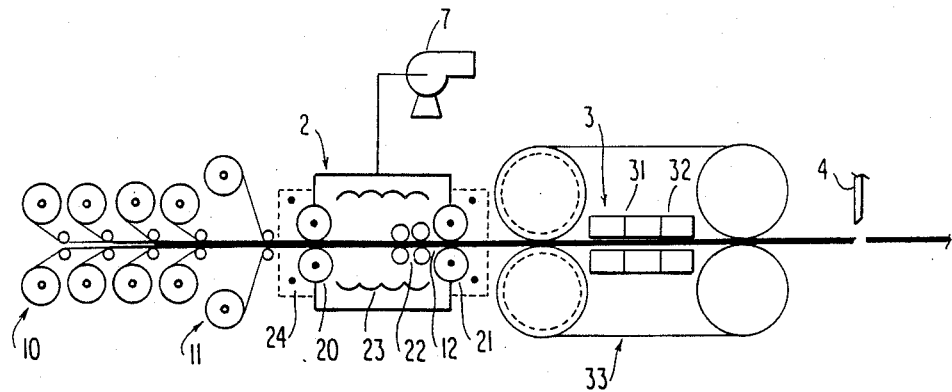

The resin-impregnated base to be used in the present invention can generally be prepared by continuously impregnating a varnish or solvent-free thermosetting resin composition comprising a phenolic resin, an epoxy resin, an unsaturated polyester resin, etc. into a reinforcing base in continuous lengths, such as kraft paper, linter paper, glass fabric, glass mat, etc., followed by solvent removal by drying or the like means.

The copper foil which can be laminated on the resin-impregnated base includes electrolytic copper foil, rolled copper foil, etc., whose back side (the side to contact with the resin-impregnated base) may be treated to provide a good adhesive surface, or whose back side may have provided thereon an adhesive layer. A suitable copper foil is selected from among them in accordance with the kind of the impregnating resin used.

The double belt press may be any of types using a fluid (e.g., air or oil) as a pressurizing medium, small diameter rollers, a combination of the pressurizing medium and the small diameter rollers, or the like means. A pressure of from 10 to 30 kg/cm$^2$ would be enough for pressing. The pressing temperature and time (retention time) are determined appropriately depending on the kind of the resin-impregnated base used. From the standpoint of productivity, it is preferable to set the pressing temperature at around 200° C., somewhat higher as compared with usual laminate molding, to thereby reduce the retention time.

In the first invention, heat-fusion of the resin-impregnated bases and copper foils under reduced pressure is performed in a vacuum chamber containing therein a heating means and a pressing means. A desired number of resin-impregnated bases and a copper foil(s) are introduced into the vacuum chamber and heated under reduced pressure to melt the impregnating resin and, at the same time, remove air and any residual volatile content present in the individual resin-impregnated bases, between the resin-impregnated bases, and between the resin-impregnated base and the copper foil. Then, the heated resin-impregnate bases and copper foils are fused into one body by pressing. In order to maintain the vacuum chamber under reduced pressure, the inlet and outlet of the chamber through which the resin-impregnated bases and copper foils are introduced or delivered are sealed by using one or more pairs of rolls. Nevertheless, it is difficult to completely prevent air from entering into the vacuum chamber through the sealing. If the air in the vicinities of the inlet and outlet should contain dust, the dust is carried with the air and sticks to the surfaces of the resin-impregnated bases and copper foils in contact with the sealing. In particular, dust adhered to the copper foil surface is liable to cause unevenness of the foil on pressing under pressure. In order to avoid this, it is preferable that the cleanness of air in the vicinities of the inlet and outlet of the vacuum chamber is controlled to class 100,000 or less, particularly 10,000 or less, by adding an appropriate device, for example, by installing the whole apparatus in a cleaned room or by blowing cleaned air from the vicinities of the inlet and outlet of the vacuum chamber.

As mentioned above, the heat treatment of the resin-impregnated bases and copper foils in the vacuum chamber aims not only at fusion while removing air among the rsin-impregnated bases or between the base and the copper foil but, in a preferred mode, at removal of bubbles which have been necessarily generated in the individual resin-impregnated bases during the preparation thereof. Accordingly, it is particularly desirable that the resin-impregnated bases and copper foils introduced into the vacuum chamber are heated while being once separated apart from each other to sufficiently remove the volatile content and the like, and then fused together by hot-pressing.

In the present invention, the requisite pressure to be applied can be reduced to a range of from 10 to 30 kg/cm$^2$, which is much lower than the conventionally employed pressure of 50 k/cm$^2$, by using the thus heat-fused laminating material.

In the second invention, the above-described heat-fusion under reduced pressure is combined with control of temperature change among the heat-fused laminating material, the pair of belts, and the resulting copper-clad laminate within a range of 100° C. In the present invention, the resin is usually cured by heating at about 200° C. under pressure. Accordingly, the temperature change during the stages of from introduction of the heat-fused laminating material through curing of the resin on heating under pressure can be controlled within 100° C. by maintaining both the heat-fused laminating material and the pair of belts at a temperature of 100° C. or more and also heating a pair of feed drums of the double belt press (the drums for introducing the laminating material into between the belts) at a temperature of 100° C. or higher. Further, it is preferable that the high temperature copper-clad laminate in which the resin has been cured by heating under pressure be cooled under pressure in a cooling zone to a temperature not less than 100° C., particularly to a temperature higher than the glass transition point of the cured resin by at least 20° C. Such cooling temperature control can easily be achieved by decreasing the amount of a cooling medium to be fed to the cooling zone or using no cooling medium at all.

The copper-clad laminate having passed through the cooling zone is then cooled to a temperature below the glass transition point of the cured resin by either allowing to cool at substantially zero pressure within the doube belt press or by blasting cool air (forced cooling) in the outside of the double belt press or the like cooling means.

Thus, the pressure condition during double belt pressing can be greatly reduced to 10 to 30 kg/cm$^2$, and dimensional stability of the resulting copper-clad laminate can greatly be improved.

The heating means to be employed for heat fusion under reduced pressure or preliminary heating may be conventional and is not particularly limited. For example, radiation heating by far infrared rays, etc. or conductive heating by means of heating rolls, etc. can be used. Radiation heating by means of a non-contact far infrared heater or a lamp is preferred.

Preferred embodiments of the process according to the present invention are illustrated below by referring to the accompanying drawings.

Figure 2:
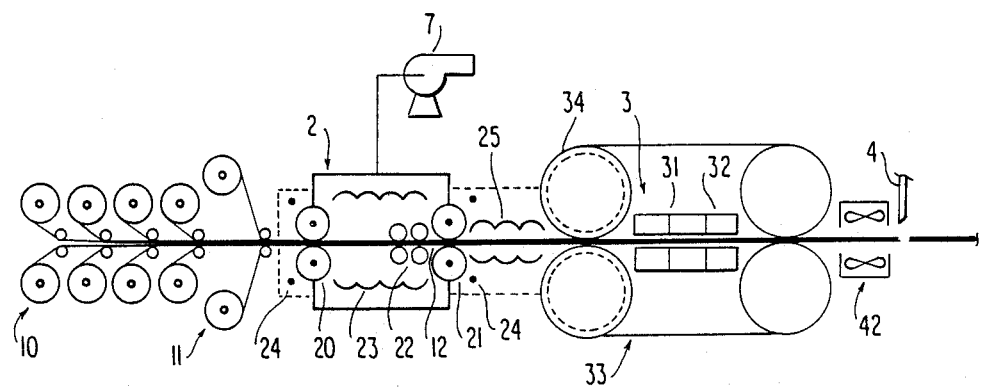

FIG. 1 is a schematic view of an apparatus for carrying out the process of the first invention. FIG. 2 is a schematic view of an apparatus for carrying out the process of the second invention, in which the same mechanism of FIG. 1 further includes a means for preliminary heating.

In FIG. 1, 8 sheets of a resin-impregnated base (10) rolled in continuous lengths and 2 sheets of a copper foil (11) are introduced into a vacuum chamber (2) kept at reduced pressure by means of a vacuum pump (7) via a pair of vacuum sealing rolls (20). In the vacuum chamber (2), the bases and copper foils are heated from both sides thereof under reduced pressure by means of a far infrared heater (23) and then united by means of two pairs of hot-press rolls (22). The thus fused laminating material (12) is discharged from the vacuum chamber (2) via a pair of vacuum sealing rolls (21) and fowarded to a double belt press (3), wherein it is heated under pressure to cure the resin and to unite the resin impregnated bases and the copper foils into a laminate. The resulting copper-clad laminate is delivered from the double belt press (3) and cut to lengths with a cutter (4).

In front of the the sealing rolls (20) and at the rear of the sealing rolls (21) is provided a simple enclosure, into which clean air is blown through inlets (24) to keep the airing these areas clean, whereby dust in the atmosphere is prevented from entering into the vacuum chamber to cause defects of the copper-clad laminate.

FIG. 2 shows an embodiment comprising the same mechanism as in FIG. 1, except that an auxiliary heater (25) is additionally provided between a vacuum chamber (2) and a double belt press (3), the feed rolls for introducing the laminating material into the double belt press are feed drums (34) equipped with a heating means, and a cooling fan (42) is provided at the rear of the outlet of the double belt press.

The laminating material (12) fused under reduced pressure is kept at the fusing temperature or further heated by means of the auxiliary heater (25) and supplied between a pair of steel belts (33) heated by means of the feed drums (34). The laminating material is continuously pressed at about 200° C. under a pressure of 10 to 30 kg/cm² in the heating zone (31) of the double belt press (3) whereby the resin is cured and the laminating material is united into a copper-clad laminate. The copper-clad laminate is then cooled in the cooling zone (32) of the double belt press (3) to a temperature slightly higher than the glass transition point of the resin. After the pressure is released, the laminate is discharged from the double belt press, quickly cooled by means of the cooling fan (42), and cut to lengths with a cutter (4).

The present invention is now illustrated in greater detail with reference to the following Examples, but it should be understood that the present invention is not deemed to be limited thereto. In these examples, all the percents are by weight unless otherwise indicated.

EXAMPLE 1

Glass fabric of 0.2 mm in thickness was impregnated with an epoxy resin varnish and dried to prepare prepregs of continuous length having a resin content of 40%.

Eight sheets of the prepregs and two 35 μm thick copper foils were laid up in the manner as shown in FIG. 1 to constitute a laminating material with the copper foil on both sides thereof. The laminating material was introduced into a vacuum chamber, where it was hot-pressed to fuse and unite into one body. The fused laminating material was introduced into a double belt press, where it was heated under pressure to prepare a copper-clad laminate of continuous length, which was delivered from the double belt press and cut with a cutter to prepare a cut-to-size copper-clad laminate.

In this example, the whole apparatus was installed in a room having a cleanness class of 100,000 or less, and the cleanness of air in the vicinities of the inlet and outlet of the vacuum chamber was ensured by blowing dry air having a cleanness class o 10,000 or less. The retention time and pressure in the vacuum chamber were 0.3 minute and 100 mmHg, respectively. The surface temperature of the prepreg during fusion was 100° C. The retention time, temperature, and pressure in the double belt press were 1.0 minute, 200° C., and 25 kg/cm², respectively.

Characteristic properties of the resulting copper-clad laminate are shown in Table 1.

COMPARATIVE EXAMPLE 1

A copper-clad laminate was produced in the same manner as in Example 1, except that the prepregs and copper foils were not heat-fused under reduced pressure and that the pressure exerted for double belt pressing was increased to 50 kg/cm².

Characteristic properties of the resulting copper-clad laminate are shown in Table 1.

EXAMPLE 2

A laminating material having the same structure as used in Example 1, except that the copper foil thickness was 18 μm, was heat-fused under reduced pressure in the same manner as in Example 1. The fused laminating material was further heated up to 120° C. by means of a far infrared heating means as shown in FIG. 2 and then introduced into a double belt press. The feed drums of the double belt press were heated to 120° C. by a heat transfer medium, and a pair of belts were thereby heated to 120° C. The heated laminating material was forwarded to a heating zone of the double belt press set at 200° C., where it was press-molded at a maximum temperature of 200° C. at a pressure of 25 kg/cm². The laminate was forwarded from the heating zone to a cooling zone, where it was cooled under pressure to 160° C., and then cooled to 130° C. at zero pressure within the double belt press. The laminate discharged out of the double belt press was rapidly cooled to 30° C. by means of air fans to obtain a copper-clad laminate.

Characteristic properties of the resulting copper-clad laminate are shown in Table 1.

COMPARATIVE EXAMPLE 2

A copper-clad laminate was produced in the same manner as in Comparative Example 1, except for changing the thickness of the copper foil to 18 μm.

Characteristic properties of the resulting copper-clad laminate are shown in Table 1.

TABLE 1

| Laminating Condition: | Example 1 | Comparative Example 1 | Example 2 | Comparative Example 2 |
| --- | --- | --- | --- | --- |
| Copper Foil Thickness ($\mu$m) | 35 | 35 | 18 | 18 |
| Heat-Fusion under Vacuum | done | not done | done | not done |
| Preliminary Heating | not done | not done | done | not done |
| Forced Cooling under Pressure | done | done | not done | done |
| Pressure of Double Belt Press (kg/cm$^2$) | 25 | 50 | 25 | 50 |
| Properties of Copper-Clad Laminate: | | | | |
| Residual Bubbles* | not observed | observed | not observed | observed |
| Surface State of Copper Foil | good | good | good | wrinkles observed |
| Dimensional Change** (%) | | | | |
| Longitudinal | 0.000 | −0.010 | 0.000 | −0.010 |
| Crosswise | −0.005 | −0.020 | −0.002 | −0.020 |
| Warpage*** (mm) | 0.3 | 2.4 | 0.2 | 2.4 |

Note:
*The copper foil was removed by etching, and the etched surface was observed under a microscope.
**Dimensional changes between before and after heat treatment at 170° C. for 30 minutes.
***A maximum warpage of the copper-clad laminate (250 × 500 mm) heated at 170° C. for 30 minutes on a horizontal plate.

As can be seen from the foregoing description, according to the present invention, a copper-clad laminate free from bubbles can be obtained without requiring a high pressure for double belt pressing by using a laminating material preliminarily fused under reduced pressure. As a result, the pressurizing mechanism and other means to be used for double belt pressing can be produced with great ease and excellent economy.

In addition, by controlling the changes of temperature of a laminating material while passing in the double belt press within a range of 100° C., a copper-clad laminate having improved dimensional stability and excellent surface conditions of the copper foil can be obtained.

It can thus be understood that the present invention provides an excellent process of practical use and industrial value from the viewpoint of both apparatus for continuous laminate molding and performance of copper-clad laminates produced.

While the invention has been described in detail and with reference to specific embodiments thereof, it will be apparent to one skilled in the art that various changes and modifications can be made therein without departing from the spirit and scope thereof.

What is claimed is:

1. A process for continuously producing a copper-clad laminate, comprising the steps of:
    (A) pre-heating at least one resin-impregnated base of continuous length and at least one copper foil of continuous length under reduced pressure in a vacuum chamber so as to produce a pre-fused laminate material;
    (B) heat fusing the resulting pre-fused laminate material of Step (()) under reduced pressure in said vacuum chamber so as to form a laminate material; and
    (C) heating the resulting laminate material of Step (B) between a pair of belts of a double belt press under pressure so as to form said copper-clad laminate,
wherein in Step (A), said copper foil is superimposed on at least one outer surface of said base, and
wherein said laminate material has a temperature of $T_1$, before Step (C); and said laminate material has a maximum temperature of $T_2$, during Step (C); and said copper-clad laminate has a temperature $T_3$, after Step (C); and wherein the range of temperature change $T_2-T_1 \leq 100°$ C. and $T_2-T_3 \leq 100°$ C., and
wherein said copper-clad laminate, while being delivered out of a pressurized cooling zone of said double belt press, has a temperature at least 20° C. higher than a glass transition temperature of said resin.

2. The process as claimed in claim 1, wherein said Steps (A) and (B) said pressure is not more han 500 mmHg.

3. The process as claimed in claim 1, wherein air in the vicinity of an inlet and an outlet of said vacuum chamber of Steps (A) and (B), through which the resin-impregnated bases and copper foils are introduced and delivered, has a cleanness class of 100,000 or less.

4. The process as claimed in claim 1, wherein said pair of belts at an inlet for supplying said resin-impregnated base and said copper foil, are heated to a temperature of not less than 100° C.

5. The process as claimed in claim 1, wherein Step (C) is carried out at a pressure of from 10 to 30 kg/cm$^2$.

* * * * *